United States Patent
Changey et al.

(10) Patent No.: US 6,297,079 B1
(45) Date of Patent: Oct. 2, 2001

(54) METHOD OF ELECTRICALLY CONNECTING IGBT TRANSISTOR CHIPS MOUNTED ON AN INTEGRATED-CIRCUIT WAFER

(75) Inventors: Nicolas Changey, Montigny-le-Roi; Alain Petitbon, Arnoult-en-Yvelines; Sophie Crouzy, Bures-sur-Yvette; Eric Ranchy, Villejuif, all of (FR)

(73) Assignee: Alstom Holdings, Paris (FR)

( * ) Notice: Subject to any disclaimer, the term of this patent is extended or adjusted under 35 U.S.C. 154(b) by 0 days.

(21) Appl. No.: 09/429,023

(22) Filed: Oct. 29, 1999

(30) Foreign Application Priority Data

Oct. 30, 1998 (FR) .................................................. 98 13690

(51) Int. Cl.[7] .................................................. H01L 21/332
(52) U.S. Cl. .......................... 438/133; 438/107; 438/118; 257/707; 257/713
(58) Field of Search .................................... 438/106, 107, 438/108, 112, 114, 118, 133; 361/760, 764, 783, 820; 257/678, 688, 707, 713

(56) References Cited

U.S. PATENT DOCUMENTS

| | | | |
|---|---|---|---|
| 5,319,237 | 6/1994 | Legros | 257/522 |
| 5,635,427 | * 6/1997 | Takahashi | 438/107 |
| 5,767,577 | * 6/1998 | Nihei et al. | 257/707 |
| 6,072,240 | * 6/2000 | Kimura et al. | 257/735 |
| 6,127,727 | * 10/2000 | Eycheson | 257/692 |

FOREIGN PATENT DOCUMENTS 2335953   7/1977   (FR).

OTHER PUBLICATIONS

Patent Abstracts of Japan, vol. 098, No. 006, Apr. 30, 1998; & JP 10 056131 A (Denso corp), Feb. 24, 1998.

* cited by examiner

*Primary Examiner*—Charles Bowers
*Assistant Examiner*—Hsien-Ming Lee
(74) *Attorney, Agent, or Firm*—Sughrue, Mion, Zinn, Macpeak & Seas, PLLC

(57) ABSTRACT

This method of electrically connecting insulated-gate bipolar transistor chips mounted on an integrated-circuit wafer (10), consists in welding the collector, emitter and gate-control electrodes (26, 28) to corresponding connection locations (14, 16) of the chips. At least some of the emitter electrodes (26) are made in a single piece in the form of a plate (20) of electrically conducting material which, on one of its large faces, has protruding parts which define connection pads that are welded to the corresponding connection locations.

12 Claims, 2 Drawing Sheets

METHOD OF ELECTRICALLY CONNECTING IGBT TRANSISTOR CHIPS MOUNTED ON AN INTEGRATED-CIRCUIT WAFER

The present invention relates to a method of electrically connecting insulated-gate bipolar transistor (IGBT) chips mounted on an integrated-circuit wafer.

Such a method conventionally consists in soldering collector, emitter and gate-control electrodes to corresponding connection locations of the chips.

Such electrodes generally consist of electrically conducting wires which electrically connect the gate and the emitter of each transistor to an electrical power supply source, these wires being ultrasonically welded to the gates and emitters.

This technique of connecting IGBT chips has a number of drawbacks.

First, the presence of wires soldered to one of the large faces of the integrated-circuit wafer prohibits the use of means for cooling the wafer on this face, which limits the number of chips which it is possible to mount on the wafer, since increasing the number of chips entails a commensurate increase in the supply current of the emitters and therefore an increase in the amount of heat dissipated.

Furthermore, in the weld zone, the materials which are in contact generally have different coefficients of expansion, which generates not insignificant mechanical stresses that may cause the electrodes to break.

The object of the invention is to overcome these drawbacks.

It therefore relates to a method of electrically connecting insulated-gate bipolar transistor chips mounted on an integrated-circuit wafer, consisting in soldering the collector, emitter and gate-control electrodes to corresponding connection locations of the chips, characterized in that at least some of the emitter electrodes are made in a single piece in the form of a plate of electrically conducting material which, on one of its large faces, has protruding parts which define connection pads that are soldered to the corresponding connection locations.

The electrical connection method according to the invention may furthermore have one or more of the following characteristics, taken individually or in any technically feasible combination:
- the connection locations being covered with a metal layer, in particular aluminium, the electrical connection method includes the following steps prior to the soldering of the emitter electrodes:
  - deoxidizing the connection locations of the electrodes;
  - depositing a layer of antioxidant material on the deoxidized connection locations;
  - depositing the solder on the connection locations;
  - depositing the said plate on the integrated-circuit wafer so as to apply the protruding parts to the connection locations; and
  - placing the plate and the wafer in a reflow oven;
- the antioxidant material is selected from nickel, chromium, gold, or an alloy of these materials;
- the deoxidation step consists in treating the wafers with nitric acid;
- during the production of the emitter electrodes, a hole is made in the piece for the gate electrode to pass through, with the interposition of an electrically insulating material;
- during the production of the emitter electrodes, a gate-control electrode is produced by forming, in the said plate, a protruding pad which is associated with a supply track and is insulated from the rest of the plate, the pad being soldered to a corresponding connection location;
- the said plate being made of an anodized metal, in particular aluminium, the production of the gate-control electrode includes the steps consisting in:
  - forming by metallization an electrically conductive layer covering the anodized surface of the pad forming the gate-control electrode;
  - forming the supply track by metallizing the anodized surface of the plate;
  - burying the metallized track; and
  - depositing a layer of antioxidant material on the pads;
- subsequent to the step consisting in forming the supply track, a metal layer is deposited on the latter;
- the step consisting in burying the metallized, track consists in anodizing the latter.

Further characteristics and advantages will become apparent from the following description, which is given solely by way of example and with reference to the appended drawings, in which:

FIG. 1 represents an integrated-circuit wafer, denoted by the general numerical reference 10.

Figure 1:
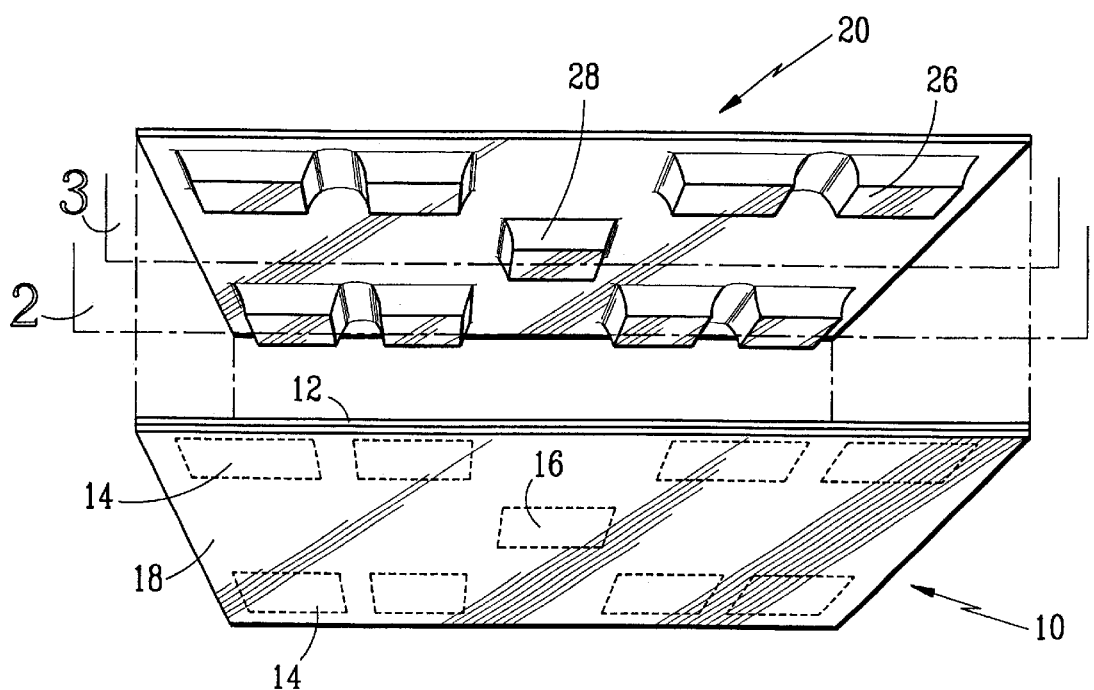
FIG. 1 is a schematic perspective view of an integrated-circuit wafer equipped with IGBT transistors and a plate defining emitter and gate control electrodes.

It consists of a conventional type of wafer, made from a silicon wafer in which insulated-gate bipolar transistor chips (not shown in this figure) are produced by conventional techniques.

The wafer 10 has a passivation layer 12, made for example of polyamide, covering the majority of one of the large faces of the wafer 10 so as to insulate the underlying silicon.

Interruption zones in the passivation layer 12 define a set of connection locations, such as 14, for connecting emitter electrodes and a connection location 16 for connecting a gate-control electrode.

As is conventional, the connection locations 14 and 16 are covered with a layer of aluminium in order to protect the underlying silicon.

The opposite large face of the wafer 10 is provided with a metal plate 18 constituting a collector electrode.

Figure 2:
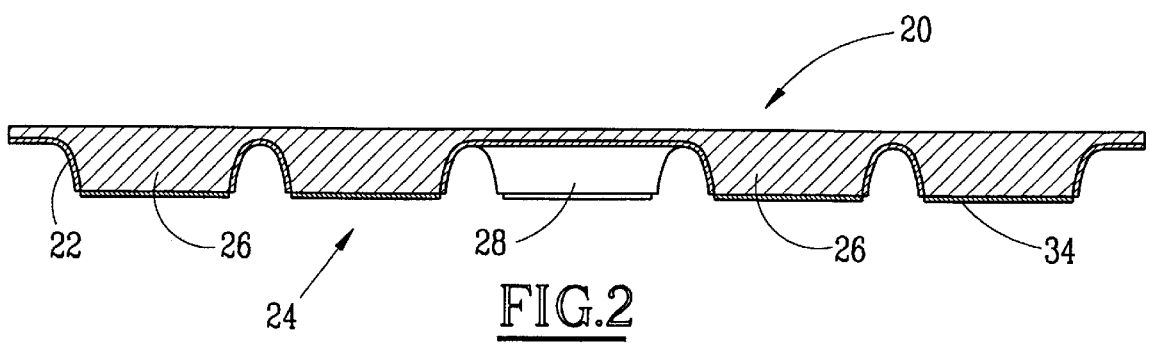
FIG. 2 is a view in section on the plane 2—2 of the plate in FIG. 1.
Figure 3:
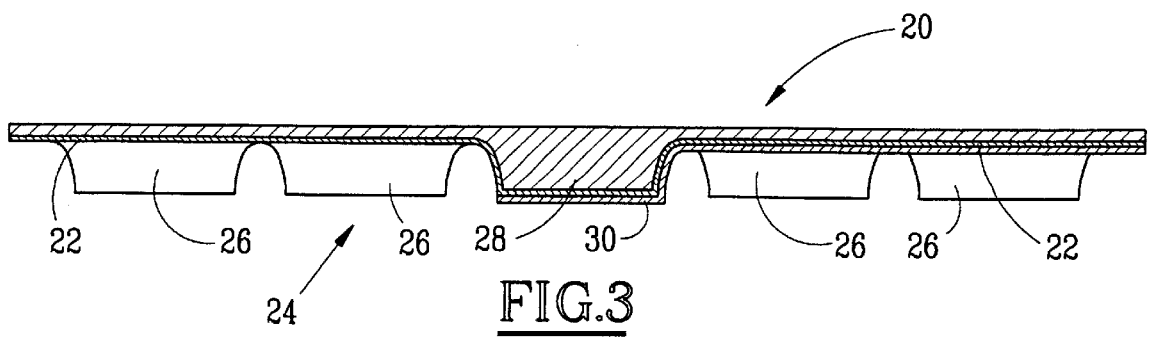
FIGS. 3, 4, 5 and 6 are views in section on the plane 3—3 of the plate in FIG. 1, showing the various steps in the production of the gate-control electrode and of the emitter electrodes.

Also referring to FIGS. 2 and 3, the emitter and gate-control electrodes are produced in a single piece 20 in the form of a plate of electrically conducting material, for example aluminium.

Although this plate 20 can be made from any other type of material suitable for the use in question, it will be assumed in the rest of the description that it is made of aluminium which has been anodized so as to proof it against oxidation, that is to say having an outer layer 22 of alumina (FIGS. 2 and 3).

The large face 24 of the plate 20, facing the Integrated-circuit wafer 10, has a set of connection pads, such as 26 and 28, some of which 26 constitute emitter electrodes, and the other 28 of which constitutes a gate-control electrode, these pads being soldered to the connection locations 14 and 16 made in the wafer 10.

The production process for the plate 20 will now be described in detail with reference to FIGS. 3 to 6, in which some of the details have been exaggerated for the sake of clarity.

Referring first to FIG. 3, the first production phase consists in forming a plate 20 of anodized aluminium having, on one of its large faces 24, the pads 26 forming emitter electrodes as well as the pad 28 forming a gate-control electrode.

As mentioned above, the plate 20 is externally covered with an anodized passivation layer 22 of alumina so as to make it inert.

This layer 22 is then metallized locally so as to form a supply track 30 for the pad 28 forming the gate-control electrode, this track 30 also covering this pad 28.

This track 30 is produced, for example, using an excimer or ultraviolet laser capable of surface decomposing the alumina constituting the layer 22 in order to reform aluminium in such a way as to make it conductive.

During the next step, the track 30 is anodized so as to bury it in order to electrically insulate it from the outside.

Figure 4:
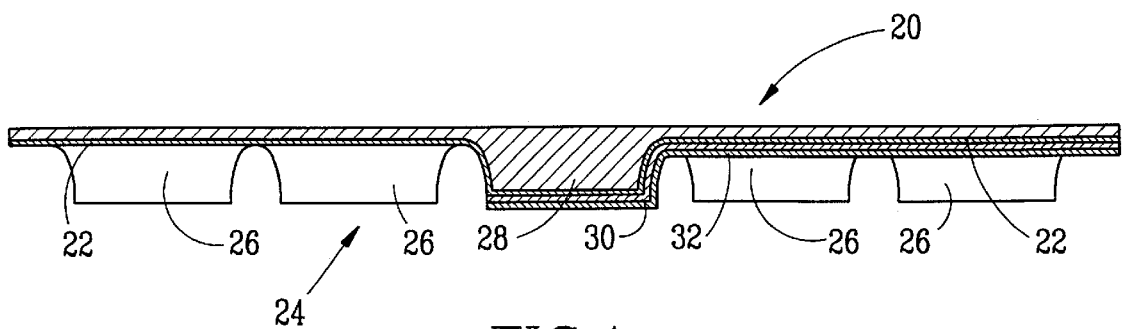

This provides the plate 20 which can be seen in FIG. 4, in which the track 30 is covered with a layer of alumina 32.

As a variant, if the passivation layer 22 is not thick enough so that it can, after formation of the track 30, undergo anodization while keeping a sufficient thickness of aluminium in the track 30, then before this anodization a layer of aluminium is deposited after the step of metallizing the anodized layer 22.

Figure 5:
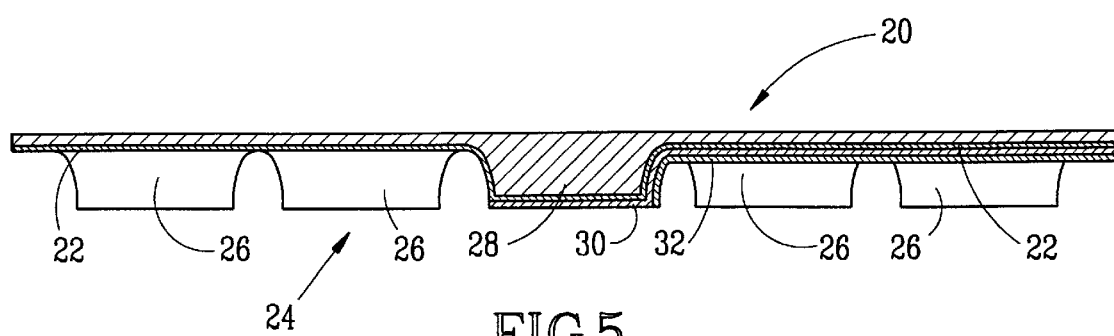

The plate 20 then undergoes a phase of machining the pads 26 and 28 so as to expose the underlying aluminium. The plate 20 represented in FIG. 5 is thus obtained, in which the metal layer constituting the supply track and covering the gate control pad 28 extends between two electrically insulating layers obtained by anodization.

The final step consists in covering the pads 26 and 28 with a layer 34 of antioxidant material which is furthermore capable of allowing the pads to be soldered to the connection locations 14 and 16 (FIG. 1).

For example, the layer of antioxidant material consists of nickel, chromium, gold, or an alloy of these metals.

Figure 6:
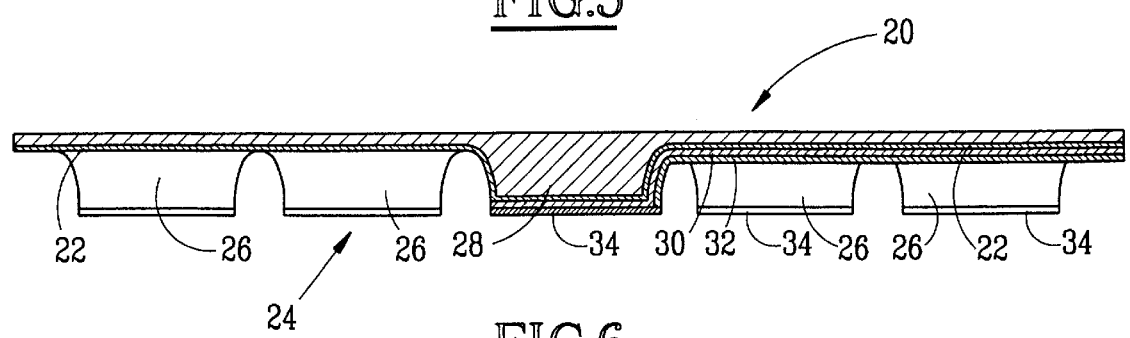

The plate 20 thus obtained, which can be seen in FIG. 6, has a set of integral pads 26 which are soldered to the corresponding connection locations 14 with a view to supplying the IGBT chip emitter, as well as a pad 28 constituting a gate-control electrode which is soldered to the corresponding connection location 16.

This gate-control pad 28 is insulated from the rest of the plate 20 by anodized layers 22 and 32 and is associated with a supply track 30 which is itself insulated from the rest of the plate 20 by the second anodized layer 32.

In order to solder the plate 20 to the integrated-circuit wafer 10, the connection locations 14 and 16 should first be deoxidized, for example by soaking the wafer 10 in a nitric acid bath, preferably for 30 seconds.

A layer of antioxidant material is deposited on the deoxidized connection locations 14 and 16, for example the same material as that used to make the connection pads 26 and 28 of the plate 20 inoxidizable that is to say nickel, chromium, gold or an alloy of these metals.

Soldering preforms are then deposited on the connection locations 14 and 16, for example ones made of SnPbAg.

After having positioned the plate 20 on the wafer 10 so that the connection pads 26 and 28 of the plate 20 are applied against the corresponding connection locations 14 and 16 of the integrated,circuit wafer 10, the combination is placed in an oven with a view to soldering the assembly.

It will be noted that the metal plate 18 constituting the collector electrode is preferably soldered simultaneously with the soldering of the plate 20 to the integrated-circuit wafer 10.

It can be seen that the invention which has just been described allows the emitters of IGBT chips to be supplied with a relatively heavy current, up to a few hundreds of amperes, since the emitter electrodes are produced in a single piece, and while retaining the possibility of providing a gate-control electrode integrated with the plate, while being insulated from the rest of it.

Figure 7:
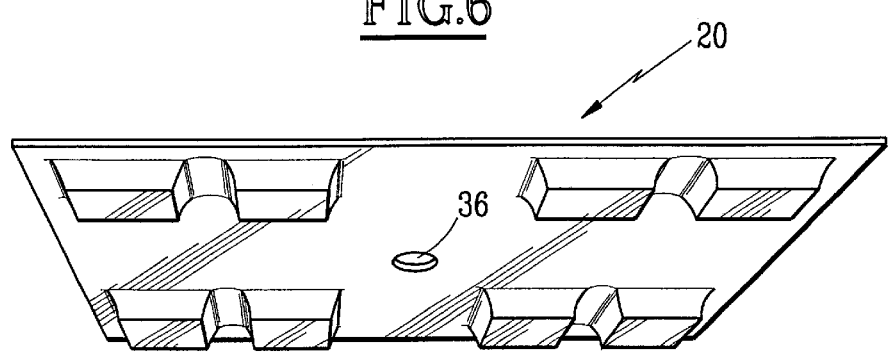
FIG. 7 is a schematic perspective view of another embodiment of the plate in FIG. 1.

It is however possible, as a variant, and as represented in FIG. 7, to provide access for soldering a gate-control electrode separate from the emitter electrodes, by making a hole 36 in the plate 20 so as to allow an electrode (not shown) to be passed through, with the interposition of an electrically insulating material.

From the description of the plate given above, it can be seen that the large face of the plate 20 opposite the connection pads 26 and 28 may be provided with suitable cooling means, thus allowing a significant increase in the number of chips integrated with the wafer 10, since it is possible to pass a relatively heavy supply current through the plate 20.

For example, the cooling means may be configured in the form of channels through which a coolant, for example deionized water, is circulated.

It will lastly be noted that the plate forming the emitter and gate-control electrodes can be soldered to commercially available integrated-circuit wafers.

The invention is not limited to the embodiments which have been described. Indeed, it is possible to produce the insulating layers extending on either side of the supply track using a different technique, in particular by depositing a suitable electrically insulating coating.

What is claimed is:

1. A method of electrically connecting insulated-gate bipolar transistor chips mounted on an integrated-circuit wafer (10), said method comprising the step of soldering the collector, emitter and gate-control electrodes (26, 28) to corresponding connection locations (14, 16) of the chips, said method further comprising the steps of:

choosing the emitter and gate-control electrodes (26, 28) to be a set of connection pads;

making at least some of the emitter electrodes (26) in a single piece in the form of a plate (20) of electrically conducting material, which, on one of its large faces, has protruding parts which form a single piece with the plate (20) and which define the connection pads; and soldering the connection pads to the corresponding connection locations.

2. The method according to claim 1, wherein the connection locations (14, 16) are covered with a metal layer, and wherein the method further comprises the following steps, prior to the soldering of the emitter electrodes:

deoxidizing the connection locations (14, 16) of the connection pads;

depositing a layer of antioxidant material on the deoxidized connection locations;

depositing the solder on the connection locations;

depositing the plate (20) on the integrated-circuit wafer (10) so as to apply the protruding parts to the connection locations; and placing the plate (20) and the wafer (10) in a reflow oven.

3. The method according to claim 2, characterized in that the antioxidant material is selected from the materials of nickel, chromium, gold, or an alloy of these materials.

4. The method according to claim 2, characterized in that the deoxidizing step comprises treating the wafer (10) with nitric acid.

5. The method according to claim 2, wherein the metal layer is aluminum.

6. The method according to claim 1, further comprising the step of, during production of the emitter electrodes (26), making a hole (36) in the plate (20) for the gate-control electrode (28) to pass through, with the interposition of an electrically insulating material.

7. The method according to claim 1, wherein no wires are used for connecting the chips.

8. Method of electrically connecting insulated-gate bipolar transistor chips mounted on an integrated-circuit wafer (10), said method comprising the step of soldering the collector, emitter and gate-control electrodes (26, 28) to corresponding connection locations (14, 16) of the chips, said method further comprising the steps of:

making at least some of the emitter electrodes (26) in a single piece in the form of a plate (20) of electrically conducting material, which, on one of its large faces, has protruding parts which define connection pads;

soldering the connection pads to corresponding connection locations (14, 16); and during production of the emitter electrodes (26), producing a gate-control electrode (28; by forming, in the plate, a protruding pad which is associated with a supply track, and is insulated from the rest of the plate, the protruding pad being soldered to a corresponding one of the connection locations (14, 16).

9. The method according to claim 8, wherein the plate (20) is made of an anodized metal, and production of the gate-control electrode (28) comprises the steps of: forming by metallization an electrically conductive layer (30) covering the anodized surface of the protruding pad forming the gate-control electrode (28);

forming the supply track by metallizing the anodized surface of the plate (20);

burying the metallized track; and depositing a layer of antioxidant material on the connection pads.

10. The method according to claim 9, further comprising, subsequent to the step of forming the supply track, the step of depositing a metal layer on the supply track.

11. The method according to claim 9, wherein the step of burying the metallized track comprises anodizing the metallized track.

12. The method according to claim 9, wherein the anodized metal is aluminum.

* * * * *